United States Patent
Bae et al.

(10) Patent No.: US 9,654,118 B2
(45) Date of Patent: May 16, 2017

(54) PHASE-ROTATING PHASE LOCKED LOOP AND METHOD OF CONTROLLING OPERATION THEREOF

(71) Applicant: Samsung Electronics Co., Ltd., Suwon-si, Gyeonggi-do (KR)

(72) Inventors: Junhan Bae, Yongin-si (KR); Kee-Won Kwon, Suwon-si (KR); Kyungho Kim, Hwaseong-si (KR); Jung Hoon Chun, Suwon-si (KR); Youngsoo Sohn, Seoul (KR); Seok Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/179,202

(22) Filed: Jun. 10, 2016

(65) Prior Publication Data

US 2016/0315625 A1    Oct. 27, 2016

Related U.S. Application Data

(62) Division of application No. 14/272,975, filed on May 8, 2014, now Pat. No. 9,385,730.

(30) Foreign Application Priority Data

May 9, 2013    (KR) .................. 10-2013-0052590

(51) Int. Cl.
*H03L 7/085*    (2006.01)
*H03D 13/00*    (2006.01)
(Continued)

(52) U.S. Cl.
CPC .......... *H03L 7/0891* (2013.01); *H03D 13/004* (2013.01); *H03L 7/081* (2013.01);
(Continued)

(58) Field of Classification Search
CPC ....... H03L 7/085; H03L 7/089; H03L 7/0891; H03L 7/091; H03D 13/003; H03D 13/004
See application file for complete search history.

(56) References Cited

U.S. PATENT DOCUMENTS 6,515,525 B2    2/2003    Hasegawa
7,538,591 B2    5/2009    Oh
(Continued)

FOREIGN PATENT DOCUMENTS

KR    20000030720 A    6/2000
KR    20100011282 A    2/2010
KR    20110078477 A    7/2011

OTHER PUBLICATIONS

Sungjoon Kim, "A Dual PFD Phase Rotating Multi-Phase PLL for 5GBPS PCI Express GEN2 Multi-Lane Serial Link Receiver in 0.13UM CMOS", 2007 Symposium on VLSI Circuits Diget of Technical Papers, pp. 234-235.
(Continued)

*Primary Examiner* — Patrick O'Neill
(74) *Attorney, Agent, or Firm* — Harness, Dickey & Pierce, P.L.C.

(57) ABSTRACT

A phase-rotating phase locked loop (PLL) may include first and second loops that share a loop filter and a voltage controlled oscillator in order to perform the operation of a phase-rotating PLL, the first and second loops configured to activate in response to an enable signal. The PLL may further include a phase frequency detection controller configured to provide the enable signal to the first and second loops in response to a transition of a coarse signal that may be applied as a digital code.

4 Claims, 16 Drawing Sheets

(51) Int. Cl.
*H03L 7/089* (2006.01)
*H03L 7/087* (2006.01)
*H03L 7/081* (2006.01)
*H03L 7/099* (2006.01)
*H03L 7/10* (2006.01)
*H03L 7/107* (2006.01)

(52) U.S. Cl.
CPC .............. *H03L 7/085* (2013.01); *H03L 7/087* (2013.01); *H03L 7/0995* (2013.01); *H03L 7/104* (2013.01); *H03L 7/107* (2013.01); *H03L 7/1072* (2013.01)

(56) References Cited

U.S. PATENT DOCUMENTS

| | | |
|---|---|---|
| 7,622,996 B2 | 11/2009 | Liu |
| 7,630,698 B2 | 12/2009 | Gierkink |
| 7,869,769 B2 | 1/2011 | Stengel et al. |
| 7,973,606 B2 | 7/2011 | Kim et al. |
| 8,063,677 B2 * | 11/2011 | Kim .................... H03L 7/081 327/147 |
| 8,063,708 B2 * | 11/2011 | Kim .................... H03L 7/0891 327/157 |
| 8,139,701 B2 | 3/2012 | Nedovic |
| 8,358,160 B2 | 1/2013 | Kim |
| 8,456,205 B2 | 6/2013 | Usugi et al. |
| 9,385,730 B2 * | 7/2016 | Bae ..................... H03L 7/087 |
| 2009/0262876 A1 | 10/2009 | Arima et al. |

OTHER PUBLICATIONS

Thomas Toifl, "0.94PS-RMS-Jitter 0.016MM2 2.5GHZ Multi-Phase Generator PPL With 360 Digitally Programmable Phase Shift for 10GB/S Serial Links", IEEE JSSC, pp. 410, 411, 607, Dec. 2005.

Jun-Han Bae, Kyoung-Ho Kim, Seok Kim, Kee-Won Kwon and Jung-Hoon Chun, "A low-power dual-PFD phase-rotating PLL with a PFD controller for 5Gb/s serial links," Circuits and Systems (ISCAS), 2012 IEEE International Symposium on, Seoul, 2012, pp. 2159-2162.

* cited by examiner

PHASE-ROTATING PHASE LOCKED LOOP AND METHOD OF CONTROLLING OPERATION THEREOF

CROSS-REFERENCE TO RELATED APPLICATIONS

This application is a divisional application of U.S. application Ser. No. 14/272,975 filed on May 8, 2014, which claims priority under 35 U.S.C. §119 to Korean Patent Application No. 10-2013-052590, filed on May 9, 2013, the entire contents of each of which are hereby incorporated herein by reference.

BACKGROUND

Example embodiments relate to a phase locked loop, and more particularly, to a phase-rotating phase locked loop that has a controller for controlling a dual phase frequency detector.

As a data rate in chip-to-chip communication gradually increases, completely recovering clock and data at a receiver is receiving more attention.

Many studies on a PLL topology that simultaneously generates and adjusts multi-clock phases for a phase-interpolation based clock data recovery (CDR) application have been conducted in consideration of high performance and low consumption power.

In the case of a dual phase frequency detector (PFD) phase-rotating PLL (DP-PLL) that has two PFDs, when implementing a phase interpolation function in the PLL, phase interpolation errors may frequently occur due to the two PFDs.

SUMMARY

Example embodiments provide a phase-rotating phase locked loop and a method of controlling the operation thereof that may reduce these phase interpolation errors.

Example embodiments also provide a phase frequency detector that may reduce these phase interpolation errors.

Example embodiments of the inventive concepts provide phase locked loops (PLLs) including first and second identical loops sharing a loop filter and a voltage controlled oscillator (VCO) so as to perform the operation of a phase-rotating PLL, wherein the first and second identical loops are activated in response to an enable signal; and a phase frequency detection controller (PFDC) providing the enable signal to the first and second identical loops in response to a transition of a coarse signal.

In one embodiment, the first identical loop may include a first phase frequency detector that compares a phase of a reference clock signal with a phase of a first input clock signal to generate a first up signal or a first down signal if the enable signal is in a first logic state; and a first charge pump generating a first charge pumping current in response to the first up signal or the first down signal.

In one embodiment, the first charge pump may be a weighted charge pump.

In one embodiment, the second identical loop may include a second phase frequency detector compares a phase of a reference clock signal with a phase of a second input clock signal to generate a second up signal or a second down signal if the enable signal is in a first logic state; and a second charge pump generating a second charge pumping current in response to the second up signal or the second down signal.

In one embodiment, the first charge pump may be a weighted charge pump.

In one embodiment, the VCO may be a ring-type VCO that generates the first and second input clock signals.

In one embodiment, a phase difference between the first and second input clock signals may be within 90 degrees.

In one embodiment, the phase locked loops may further include a multiplexer selectively outputting the first and second input clock signals among a plurality of clock signals that are output from the VCO.

In one embodiment, a phase difference between the first and second input clock signals may be 180 degrees.

In one embodiment, the PFDC may include a pulse generator detecting a transition of the coarse signal; a selector selecting one of the first and second input clock signals according to a state of the coarse signal; and a flip flop generating the enable signal through a latch output by receiving an output of the pulse generator with a data input, by receiving an output of the selector with a clock input and by performing a latch operation.

Example embodiments of the inventive concepts provide phase frequency detectors of a phase locked loop that include a first flip flop generating a latched output as a up signal according a reference clock signal if an enable signal is in a first logic state; a second flip flop generating a latched output as a down signal according an input clock signal if the enable signal is in a first logic state; and a logic gate gating the up signal and the down signal, wherein the logic gate resets the first flip flops that together perform an operation of comparing a phase of the reference clock signal with a phase of the input clock signal.

In one embodiment, the enable signal may have a second logic state section each time a state of a coarse signal is transited.

In one embodiment, the first and second flip flops may be D flip flops that receive the enable signal with a data input in common.

In one embodiment, the enable signal may be transited from a second logic state to the first logic state in response to an edge of the input clock signal that rises right before two edges of signals to be phase-compared occur.

Example embodiments of the inventive concepts provide methods of controlling an operation of a phase locked loop (PLL) that include providing first and second identical loops in the PLL that includes a loop filter and a voltage controlled oscillator (VCO), wherein each of the first and second identical loop includes a phase frequency detector and a charge pump; activating the phase frequency detector in the first or second identical loop in response to a rising edge of one input clock signal, when there is a transition of a coarse signal, wherein the one input clock signal is selected according to an interpolation range of first and second input clock signals received from the VCO; and controlling an operation of a phase-rotating PLL for the PLL after activating the operation of the phase frequency detector.

At least one example embodiment relates to a phase locked loop (PLL) configured to adjust phases of input clock signals in response to an enable signal.

In one embodiment, the PLL includes dual phase frequency detectors (PFDs) configured to generate output signals based on the input clock signals and a reference signal, if the enable signal is in a first state; and a PFD controller configured to set the enable signal to the first state to instruct the dual PFDs to generate the output signals when rising edges of the input clock signals have a phase difference of less than 180 degrees.

In one embodiment, the PFD controller is configured to instruct the dual PFDs to generate the output signals when a second one of the input clock signals, having a phase of 90 degrees more than a first one of the input clock signals, transitions from a second state to the first state.

In one embodiment, the dual PFDs include a first PFD configured to generate a first output signal; and a second PFD configured to generate a second output signal, wherein the first PFD and the second PFD each include a first flip-flop and a second flip-flop, the first flip-flop and the second flip-flop each having an input terminal and a reset terminal, the input terminal configured to receive the enable signal and the reset terminal configured to receive a reset signal to reset the first PFD and the second PFD if the output signal and the second output signal are set to a first logic level.

In one embodiment, the first flip-flops have an clock terminal configured to receive the reference signal; and the second flip-flops have a clock terminal configured to receive one of the input clock signals.

In one embodiment, the controller include a pulse generator configured to generate a pulse in response to a transition of a code signal; a selector configured to output either the first one of the input clock signal or the second one of the input clock signal based on the code signal; and a flip-flop configured to perform a latch operation on the pulse in response to the output of the selector.

BRIEF DESCRIPTION OF THE DRAWINGS

The accompanying drawings are included to provide a further understanding of the inventive concepts, and are incorporated in and constitute a part of this specification. The drawings illustrate example embodiments of the inventive concepts and, together with the description, serve to explain principles of the inventive concept. In the drawings.

DETAILED DESCRIPTION OF THE EMBODIMENTS

Figure 1:
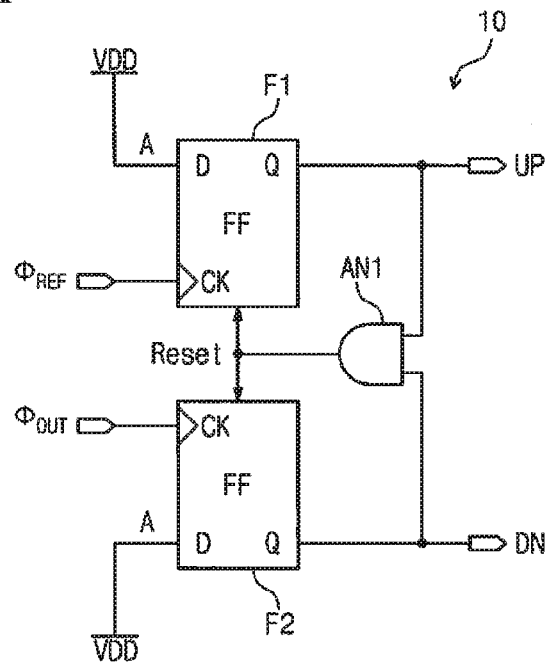
FIG. 1 is a circuit diagram of a typical phase frequency detector (PFD)

These objects, other objects, characteristics, and advantages of the present invention will be easily understood through the following example embodiments in conjunction with the accompanying drawings. Example embodiments may, however, be embodied in different forms and should not be construed as limited to the example embodiments set forth herein. Rather, these example embodiments are provided so that this disclosure will be thorough and complete, and will fully convey the scope of the embodiments to those skilled in the art.

In the specification, what any elements or lines are connected to a target element block includes their direction connections and indirect connections block through other elements.

Moreover, the same or similar reference signs that are presented in the drawings represent the same or similar components if possible. In some drawings, the connection between elements or lines is just represented for effective explanation of related technologies and other elements or circuit blocks may be further included.

Note that an embodiment described and exemplified herein includes a complementary embodiment thereof, and details for circuit elements that configure a flip flop or PLL are not described in order not to make the subject of the present invention ambiguous.

FIG. 1 is a circuit diagram of a typical phase frequency detector (PFD).

Referring to FIG. 1, a PFD 10 may include first and second flip flops F1 and F2, and an AND gate AN1.

In the typical PFD 10, the input of the first flip flop F1 is fixed at a level of a power source voltage VDD, namely, to be logic HIGH, and a clock CK input receives a reference clock signal ΦREF. The first flip flop F1 generates a latched output as an up signal UP and outputs it through the output Q.

Further, in the typical PFD 10, the input of the second flip flop F2 is fixed at a level of a power source voltage VDD, namely, to be logic HIGH, and the clock CK receives an input clock signal ΦOUT. The second flip flop F2 generates a latched output as a down signal DN and outputs it through the output Q.

The AND gate AN1 performs an AND operation on the up signal UP and the down signal DN and provides a result of the AND operation to a reset terminal of the first and second flip flops F1 and F2 that together perform the operation of comparing the phase of the reference clock signal ΦREF with that of the input clock signal ΦOUT.

Figure 2:
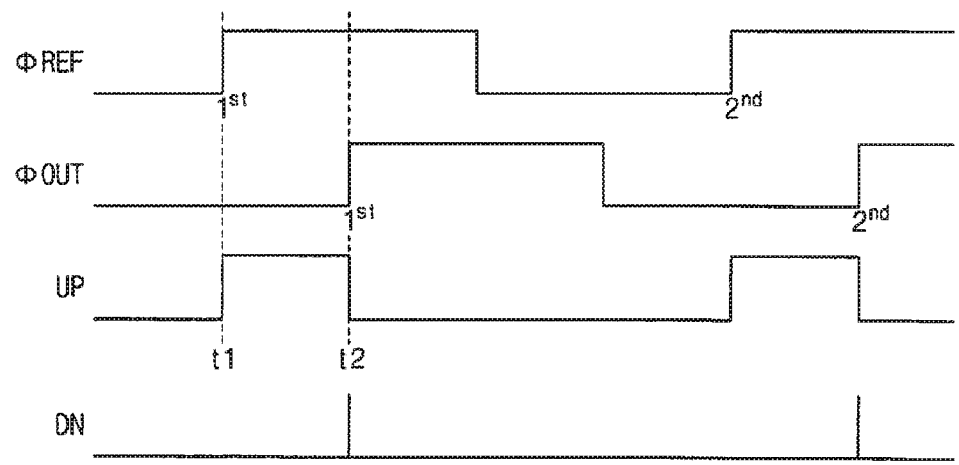
FIG. 2 is an operational timing diagram according to a first case of FIG. 1.
Figure 3:
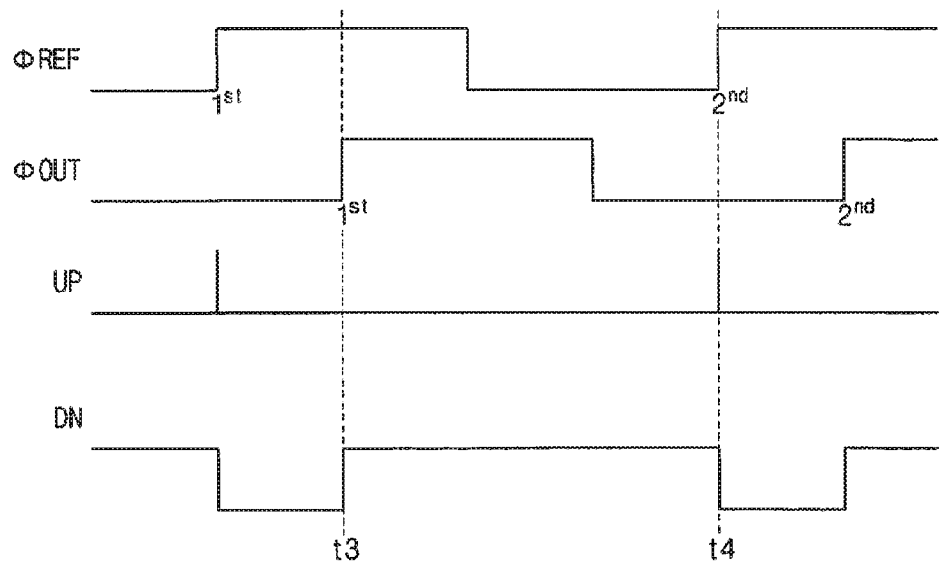
FIG. 3 is an operational timing diagram according to a second case of FIG. 1.

The typical PFD 10 of FIG. 1 may generate two different outputs when the reference clock signal ΦREF and the input clock signal ΦOUT input thereto have the same phase, as shown in FIGS. 2 and 3.

FIG. 2 is an operational timing diagram according to a first case of FIG. 1.

As illustrated in FIG. 2, when the detection of the PFD 10 is conducted in a leading case where the phase of the reference clock signal ΦREF leads by 90 degrees than that of the input clock signal ΦOUT, the up signal UP is represented as a waveform UP through the output Q of the first flip flop F1. As a result, the PFD 10 compares a first rising edge of the reference clock signal ΦREF appearing at the time point t1 with a first rising edge of the input clock signal ΦOUT appearing at the time point t2 and generates the up signal UP having the waveform UP of FIG. 2.

FIG. 3 is an operational timing diagram according to a second case of FIG. 1.

As illustrated in FIG. 3, when the detection of the PFD 10 is conducted in a lagging case, where the phase of the reference clock signal ΦREF lags by 270 degrees than that of the input clock signal ΦOUT, the down signal DOWN is represented as a waveform DOWN through the output Q of the second flip flop F2. As a result, the PFD 10 compares a second rising edge of the reference clock signal ΦREF appearing at the time point t4 with a first rising edge of the input clock signal ΦOUT appearing at the time point t3 and generates the down signal DOWN having the waveform DOWN of FIG. 3.

As illustrated in FIGS. 2 and 3, while there is a 90 degree phase difference between the reference clock signal and the input clock signal in both FIGS. 2 and 3, the outputs produced are different depending on which edges the PFD 10 compares. This phenomenon may be explained with reference to FIG. 4.

Figure 4:
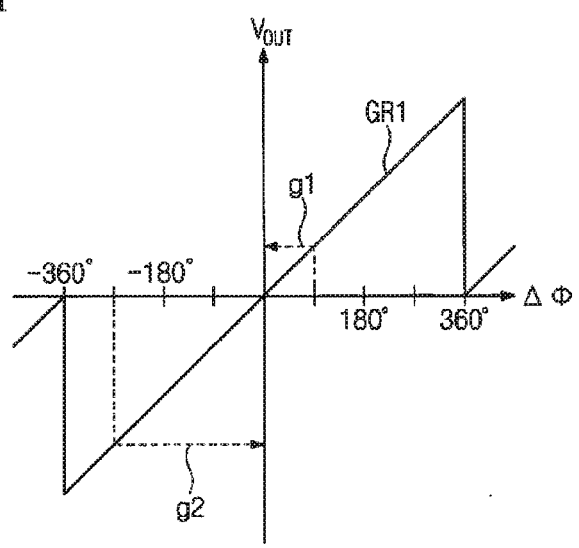
FIG. 4 is a graph of input and output characteristics of FIG. 1.

FIG. 4 is a graph of input and output characteristics of FIG. 1.

In FIG. 4, the horizontal axis represents the phase (ΔΦ) and the vertical axis represents the voltage Vout. Here, the voltage Vout is defined as the difference between the average values of the up signal and the down signal. The graph GR1 represents the input and output characteristics of the PFD 100.

The reference sign g1 represents PFD detection in a leading case where the phase of the reference clock signal ΦREF leads by 90 degrees than that of the input clock signal ΦOUT.

The reference sign g2 represents PFD detection in a lagging case where the phase of the reference clock signal ΦREF lags by 270 degrees than that of the input clock signal ΦOUT.

As such, two outputs of the PFD 10 may appear if different edges are captured causing phase interpolation errors.

Figure 5:
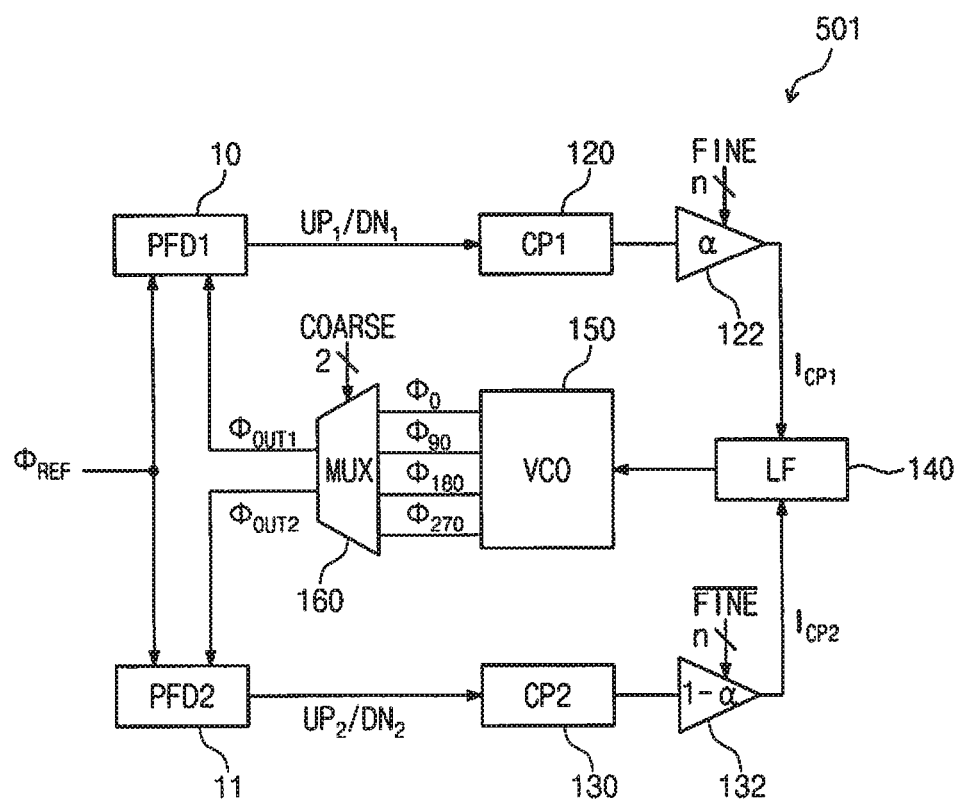
FIG. 5 is a block diagram of a typical phase-rotating phase locked loop (PLL) including a circuit of FIG. 1.

FIG. 5 is a block diagram of a typical phase-rotating phase locked loop (PLL) including the PFD 10 of FIG. 1.

Referring to FIG. 5, a DP-PLL 501 includes PFD1 and PFD2 10 and 11, first and second charge pumps CP1 and CP2 120 and 130, first and second weighting unit 122 and 132, a loop filter 140, a voltage control oscillator (VCO) 150, and a multiplexer 160.

The PFD1 10 and PFD 11 may be represented by the circuit of FIG. 1.

The PFD1 10 compares the phase of the reference clock signal ΦREF with the phase of a first input clock signal ΦOUT1 and outputs a first up signal UP1 or a first down signal DN1.

The PFD2 11 compares the phase of the reference clock signal ΦREF with the phase of a second input clock signal ΦOUT2 and outputs a second up signal UP2 or a second down signal DN2.

The first charge pump 120 performs charge pumping in response to the first up signal UP1 or the first down signal DN1. The first weighting unit 122 multiplies a charge pumping current output from the first charge pump 120 by a weight factor α to generate a weighted charge pumping current ICP1 that is controlled by a FINE digital code.

The second charge pump 130 performs charge pumping in response to the second up signal UP2 or the second down signal DN2. The second weighting unit 132 multiplies a charge pumping current output from the second charge pump 130 by a weight factor 1−α to generate a second weighted charge pumping current ICP2 that is controlled by a digital code FINE'.

The loop filter 140 receives the first and second weighted charge pumping currents ICP1 and ICP2 and generates a control voltage.

A ring-type VCO 150 output a plurality of input clock signals having an oscillation frequency depending on the control voltage that is applied from the loop filter 140, the plurality of input clock signals may have different phases.

In response to a coarse digital code COARSE, the multiplexer 160 selects first and second input clock signals ΦOUT1 and ΦOUT2 among the plurality of input clock signals that are output from the VCO 150. Here, the first and second input clock signals are adjacent to each other and may have a phase difference of 90 degrees. For example, the phase of the first input clock signal ΦOUT1 may lead by 90 degrees than that of the second input clock signal ΦOUT2.

The first and second input clock signals ΦOUT1 and ΦOUT2 are respectively applied to the PFD1 10 and the PFD2 11 through feedback.

The first and second weighted charge pumping currents ICP1 and ICP2 are complementarily controlled by the FINE digital code. The current ICP1+ICP2 may be constant and the ratio ICP1:ICP2 of the first weighted charge pumping current ICP1 to the second weighted charge pumping current determines the phases of the first and second input clock signals ΦOUT1 and ΦOUT2 relative to the reference clock signal ΦREF such that the reference clock signal ΦREF may be expressed as:

$$\Phi REF = \alpha * \Phi OUT1 + (1-\alpha) * \Phi OUT2, \text{ where } (0 \leq \alpha \leq 1). \quad \text{Eq. (1)}$$

For example, if the first weighted charge pumping current ICP1 is greater than the second weighted charge pumping current ICP2 (that is, if α is greater than 0.5), the first input clock signal ΦOUT1 is aligned relatively closer to the reference clock signal ΦREF. On the contrary, if the second weighted charge pumping current ICP2 is greater than the first weighted charge pumping current ICP1 (that is, if α is smaller than 0.5), the second input clock signal ΦOUT2 is aligned relatively closer to the reference clock signal ΦREF. In this way, the phase of the reference clock signal ΦREF is controlled and is locked to between the first and second input clock signals ΦOUT1 and ΦOUT2.

However, the phase interpolation schema of the DP PLL 501 shown in FIG. 5 has potential drawbacks due to the structural characteristics of the PFD 10/11 described in FIGS. 1 to 3.

For example, when phase interpolation needs to be performed between 0 degree and 90 degrees, phase interpolation errors may occur if the phase interpolation between 90 degrees and 360 degrees is performed in the DP-PLL 501.

Figure 6:
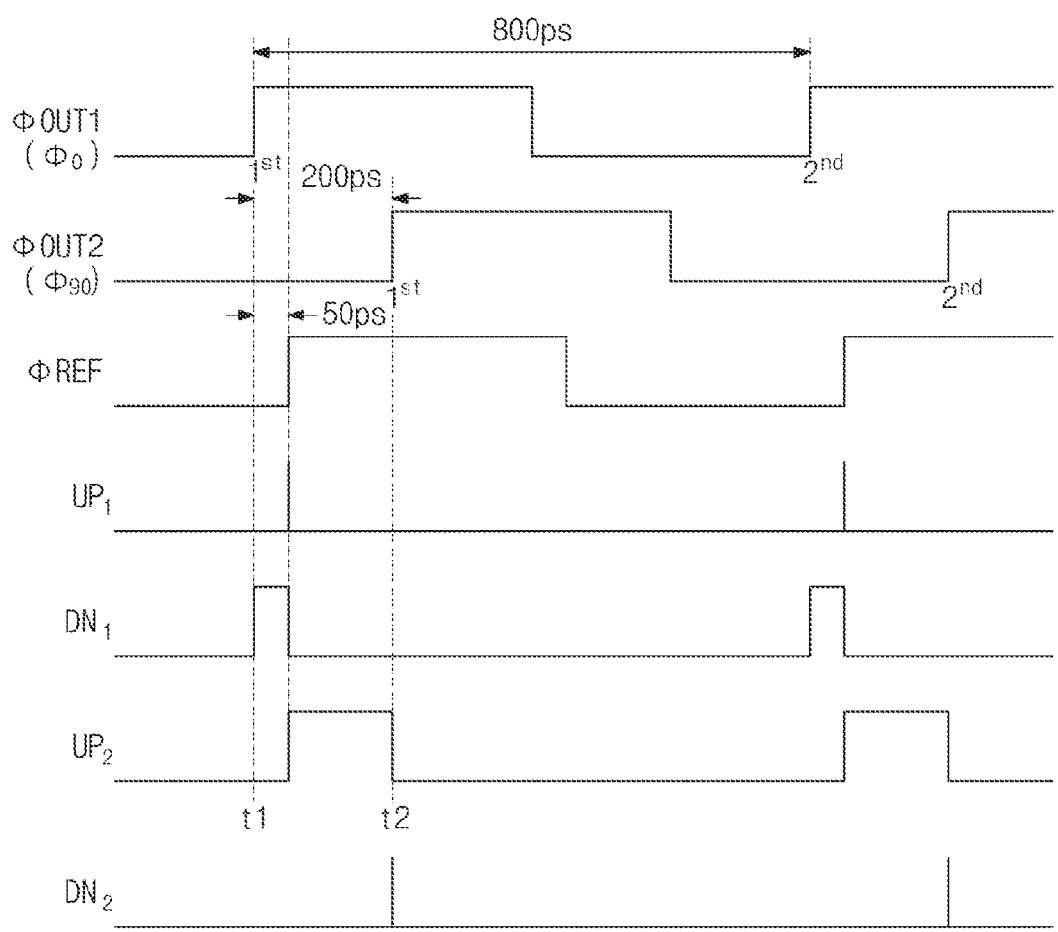
FIG. 6 is an operational timing diagram of desired phase interpolation according to FIG. 5.

FIG. 6 is an operational timing diagram of desired phase interpolation according to FIG. 5.

Referring to FIG. 6, the phase interpolation related operational timing of the DP-PLL of FIG. 5 is represented with the weight factor α of a first charge pump CP1 being 0.75.

The first input clock signal ΦOUT1 leads the reference clock signal ΦREF by 50 picosecond (ps). Therefore, the PFD1 10 of FIG. 5 generates the first down signal DN1 having the waveform DN1. Here, the cycle of the first input clock signal ΦOUT1 is assumed to be 800 ps.

On the other hand, the phase of the second input clock signal ΦOUT2 lags the reference clock signal ΦREF by 150 ps. Therefore, the PFD2 11 generates the second up signal UP2 having the waveform UP2.

As a result, the phase interpolation of FIG. 6 is performed on the basis of the operation of comparing two rising edges at the time points t1 and t2, namely, on the basis of the operation when the phase of the first input clock signal ΦOUT1 leads the second input clock signal ΦOUT2 by 90 degrees.

Thus, the phase interpolation timing of FIG. 6 becomes desired phase interpolation for the DP-PLL 501 of FIG. 5. However, if the DP-PLL of FIG. 5 performs the phase interpolation of FIG. 7, operation errors may occur.

Figure 7:
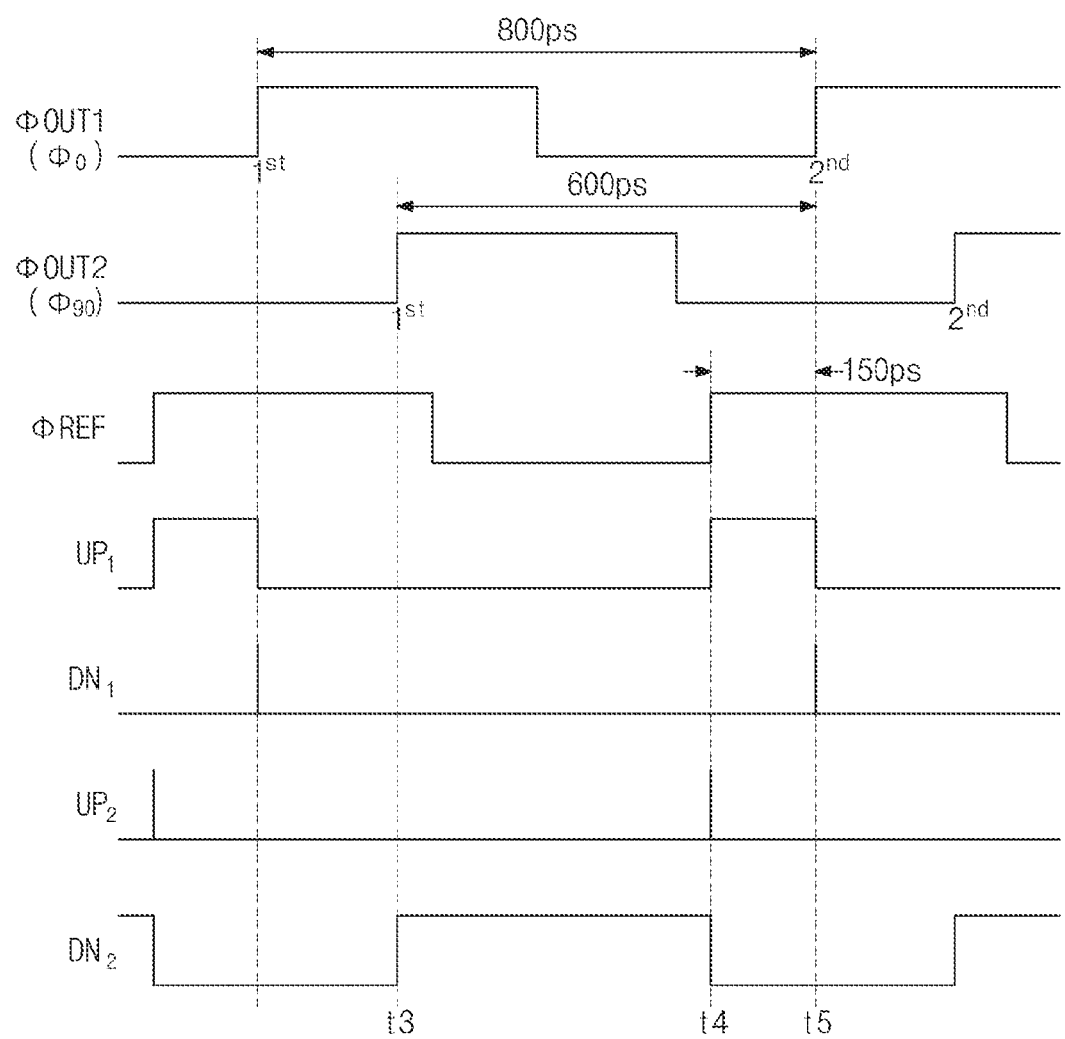
FIG. 7 is an operational timing diagram of undesired phase interpolation according to FIG. 5.

FIG. 7 is an operational timing diagram of undesired phase interpolation according to FIG. 5.

Referring to FIG. 7, the phase interpolation related operational timing of the DP-PLL of FIG. 5 is represented with the weight factor α of the first charge pump CP1 is 0.75.

At the time point t5, it may be said that the phase of the first input clock signal ΦOUT1 lags the second input clock signal ΦOUT2 by 270 degrees.

The PFD1 10 of FIG. 5 generates the first up signal UP1 having the waveform UP1 depending on what the phase of the first input clock signal ΦOUT1 lags by 150 ps than that of the reference clock signal ΦREF. Here, the cycle of the first input clock signal ΦOUT1 is assumed to be 800 ps.

On the other hand, the PFD2 110 generates the second down signal DN2 having the waveform DN2 depending on what the phase of the second input clock signal ΦOUT2 leads by 450 ps than that of the reference clock signal ΦREF.

As a result, the phase interpolation of FIG. 7 is performed on the basis of the operation of comparing two rising edges at the time points t3 and t5, namely, on the basis of the operation when the phase of the first input clock signal ΦOUT1 lags the second input clock signal ΦOUT2 by 270 degrees.

Thus, the phase interpolation timing of FIG. 7 becomes undesired phase interpolation for the DP-PLL of FIG. 5. That is, if the DP-PLL of FIG. 5 performs the phase interpolation of FIG. 7, phase interpolation errors may occur.

As described above, since the typical DP-PLL 501 shown in FIG. 5 has the dual phase frequency detector 10 shown in FIG. 1, phase interpolation errors may occur.

Figure 8:
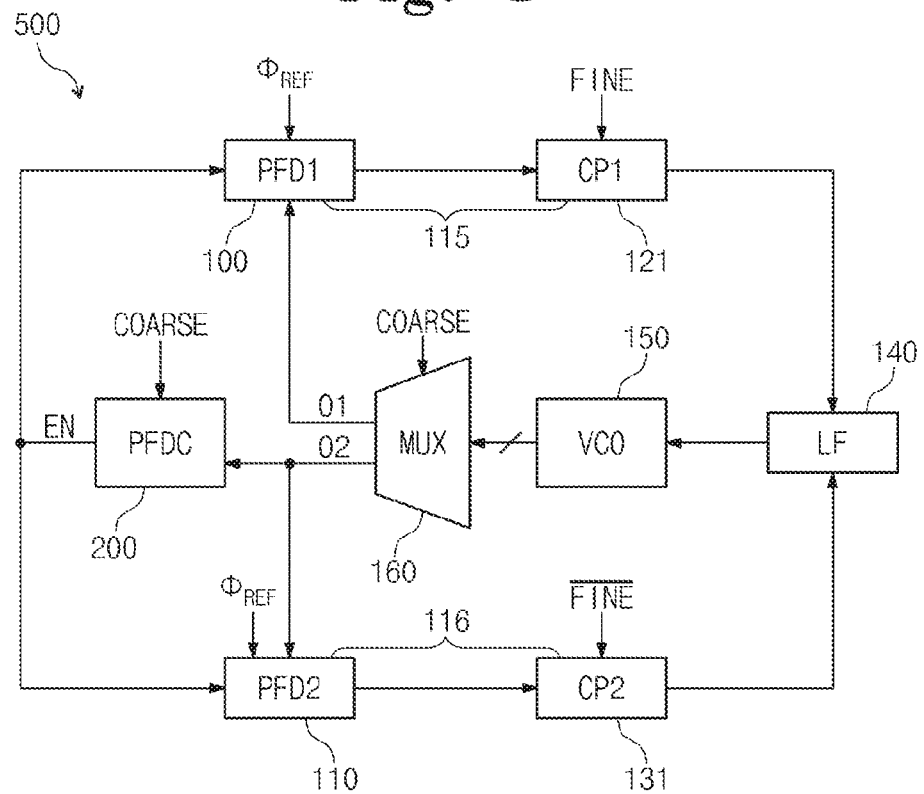
FIG. 8 is a block diagram of a phase-rotating PLL according to an example embodiment.

FIG. 8 is a block diagram of a phase-rotating PLL according to an example embodiment.

Referring to FIG. 8, the phase-rotating PLL 500 includes first and second identical loops 115 and 116 that share the loop filter 140 and the VCO 150 in order to perform the operation of the phase-rotating PLL and are activated in response to the enable signal EN.

Moreover, the phase-rotating PLL 500 includes the phase frequency detection controller (PFDC) 200 that provides the enable signal EN to the first and second identical loops 115 and 116 in response to the transition of a COARSE signal.

The phase-rotating PLL 500 may include a multiplexer 160 that selectively outputs, first and second input clock signals 01 and 02 among a plurality of clock signals that are output from the VCO 150.

In FIG. 8, the first identical loop 115 may include a first PFD1 100 that compares the phase of the reference clock signal ΦREF with that of the first input clock signal ΦOUT1 to generate a first up signal or a first down signal if the enable signal EN is in a first logic state (for example, HIGH), and a first charge pump 121 that generates a first charge pumping current in response to the first up signal or the first down signal.

The first charge pump 121 may be a weighted charge pump that includes the charge pump 120 and the weighting unit 122.

Similarly, the second identical loop 116 may include the second PFD2 110 that compares the phase of the reference clock signal ΦREF with that of the second input clock signal ΦOUT2 to generate a second up signal or a second down signal if the enable signal EN is in the first logic state, and a second charge pump 131 that generates a second charge pumping current in response to the second up signal or the second down signal.

Likewise, the second charge pump 131 may be a weighted charge pump.

The VCO 150 may be a ring-type VCO that generates the first and second input clock signals 01 and 02 such that the phase difference between the first and second input clock signals 01 and 02 may be within 90 degrees.

In the case of FIG. 8, the PFDC 200 may include a pulse generator (210 of FIG. 10) that detects the transition of the COARSE signal, and a flip flop (214 of FIG. 10) that generates the enable signal EN through a latch output Q by receiving the output of the pulse generator with a data input D and the second input clock signal ΦOUT2 with a clock input CK, and then performing a latch operation. That is, the PFDC 200 of FIG. 8 may have a structure that is obtained by removing a selector 212 from the circuit of FIG. 10 or FIG. 11.

Since the phase-rotating PLL 500 of FIG. 8 operates only when the enable signal EN of the PFDC 200 is in the first logic state, such phase interpolation errors as described with respect to FIG. 7 do may not occur.

Figure 9:
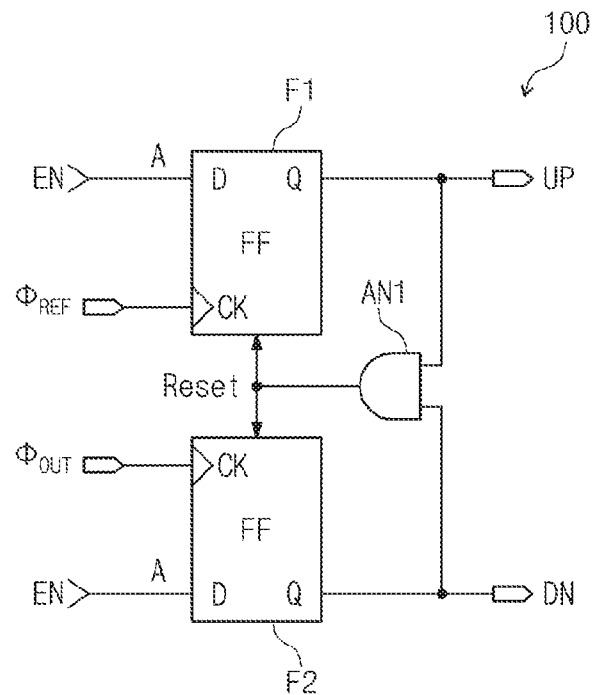
FIG. 9 is an exemplary circuit diagram of a PFD of FIG. 8.

FIG. 9 is an exemplary circuit diagram of the PFD 100 of FIG. 8.

Referring to FIG. 9, the PFD 100 includes first and second flip flops F1 and F2 that have enable signal EN inputs.

Node A connected to each of the D inputs of the first and second flip flops F1 and F2 receives the enable signal EN, such that the input D is a power source voltage VDD or a ground voltage GND according to the state of the enable signal EN. Thus, when the voltage level of the node A is in a second logic state, the operations of the first and second flip flops F1 and F2 are inactivated.

As a result, even if the input clock signals ΦREF and ΦOUT applied to the clock CK experience transitions, the PFD 100 does not compare the phases of the input clock signals ΦREF and ΦOUT until the enable signal EN goes to HIGH.

The AND gate AN1 performs an AND operation on the up signal UP and down signal DN of each output Q of the first and second flip flops F1 and F2 and applies the result to the Reset of each of the first and second flip flops F1 and F2.

The PFD 100 having the enable signal EN input as shown in FIG. 9 is disabled when the enable signal En is the second logic state, and compares the phases of the input clock signals ΦREF and GOUT to generate a up signal Up or a down signal DN when the enable signal EN is the first logic state.

The PFD of FIG. 9 may correspond to each of the PFD1 100 and the PFD2 110 of FIG. 8. That is, each of the PFD1 100 and PFD2 110 of FIG. 8 includes the PFD of FIG. 9.

Figure 10:
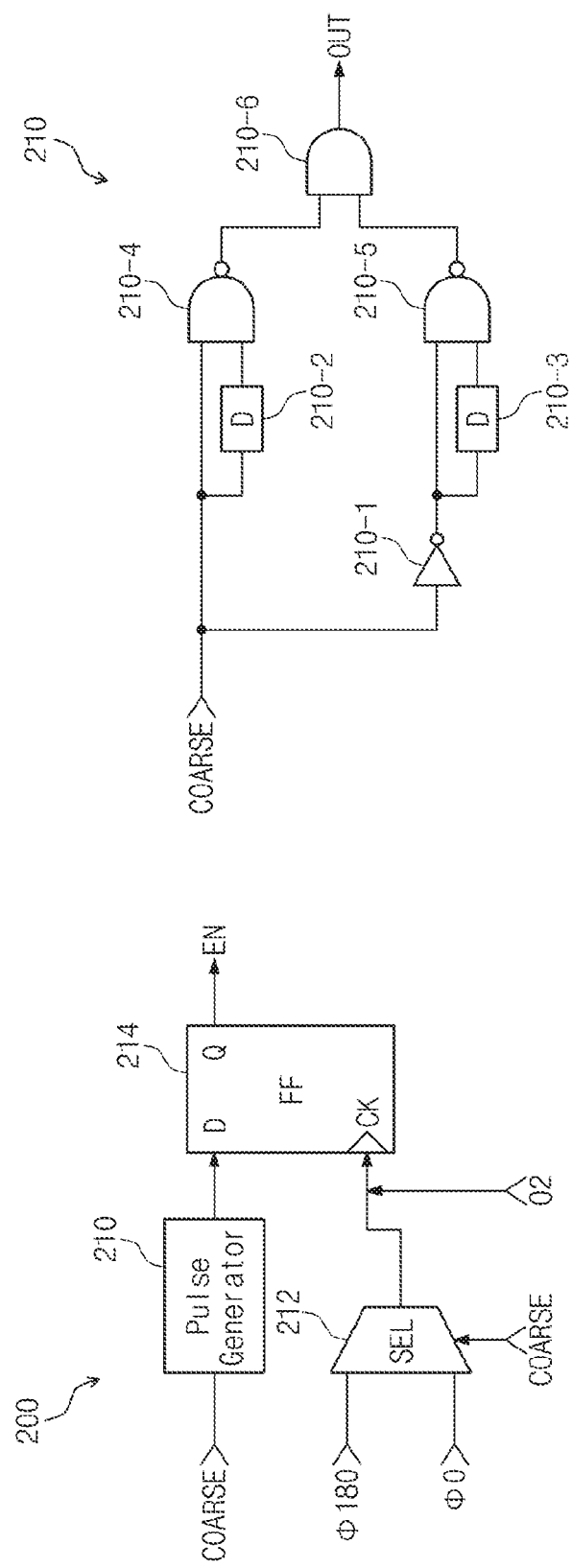
FIG. 10 is an exemplary circuit diagram of a phase frequency detecting controller of FIG. 8.

FIG. 10 is an example circuit diagram of a phase frequency detection controller (PFDC) included in the phase-rotating PLL of FIG. 8.

Practically, the PFDC 200 of FIG. 8 has a structure that is obtained by removing a selector 212 from the circuit of FIG. 10. In this case, the second input clock signal ΦOUT2 of the multiplexer 160 is applied as the input signal 02 to the clock CK of the flip flop 214.

Figure 14:
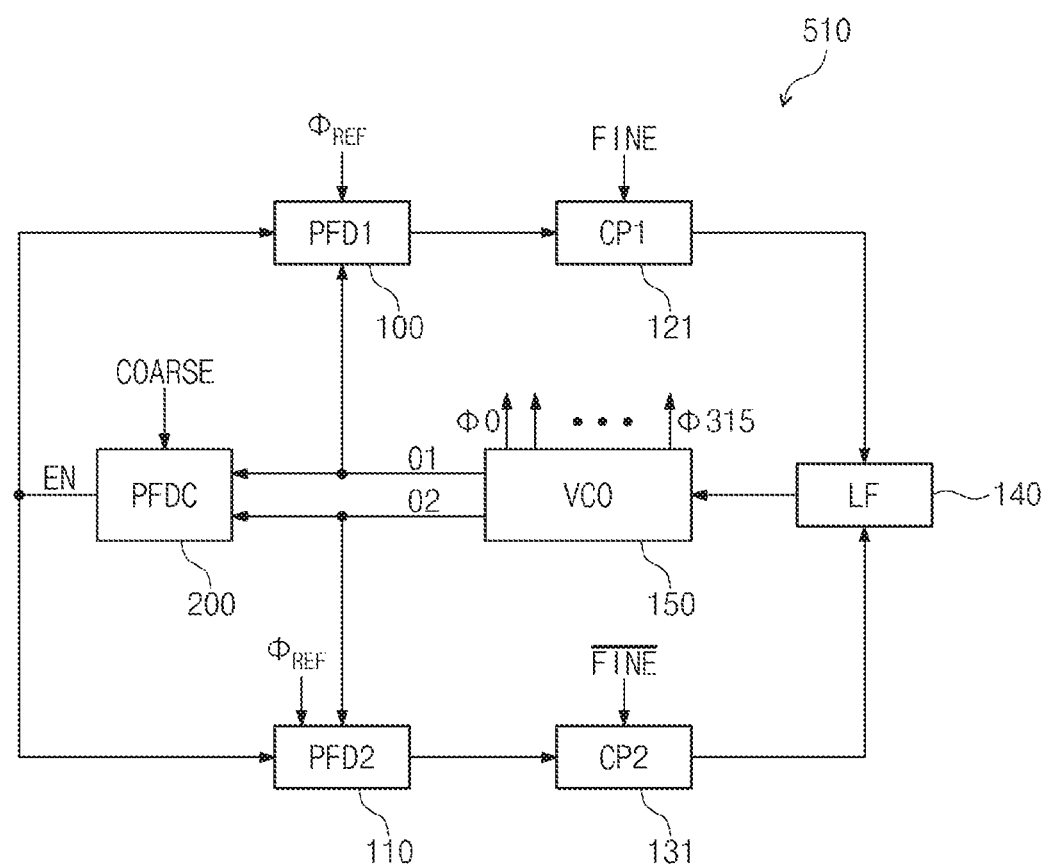
FIG. 14 is a block diagram of a phase-rotating PLL according to another example embodiment.

In contrast to the DP PLL 500 of FIG. 8, as illustrated in FIG. 14, in a DP PLL 510, the selector 212 may be included in the PFDC 200 of FIG. 10.

The pulse generator 210 of FIG. 10 may include an inverter 210-1, delay units 210-2 and 210-3, NAND gates 210-4 and 210-5, and an AND gate 210-6.

When the coarse digital code COARSE is applied, the pulse generator 210 generates an output pulse ΦOUT through the AND gate 210-6.

The output pulse ΦOUT is applied to the input D of the flip flop 214 of FIG. 10. The flip flop 214 performs a latch operation to generate the enable signal EN having the waveform EN of FIG. 13.

Figure 13:
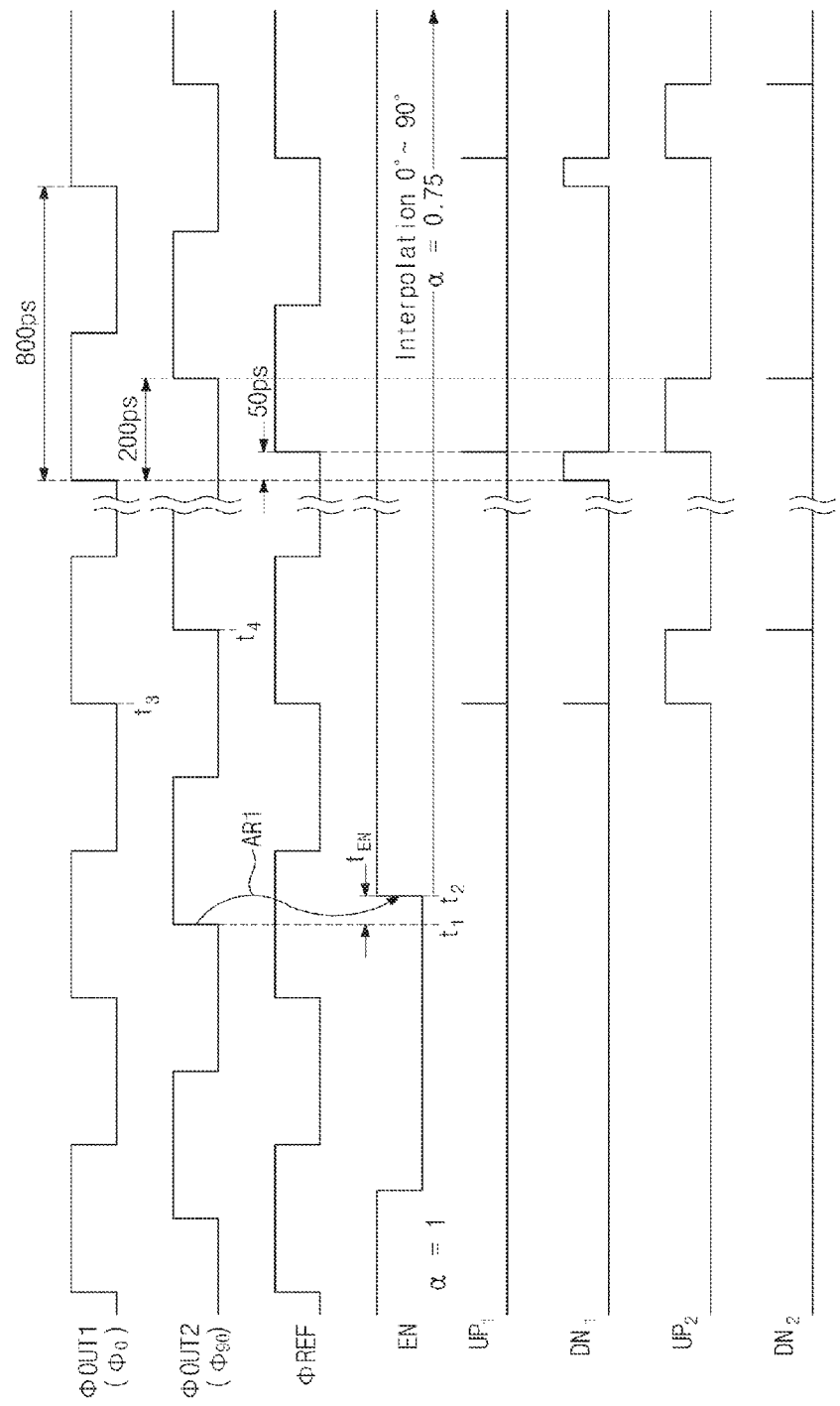
FIG. 13 is an operational timing diagram according to FIG. 12.

As illustrated in FIG. 13, a length of a low level of the enable signal EN may be increased and decreased by adjusting the delay of the delay units 210-2 and 210-3.

Returning to FIG. 10, the PFDC 200 generates the enable signal EN in order to detect desired edges each time the transition of the signal COARSE occurs. That is, when the range of phase interpolation changes, the PFD1 and PFD2 100 and 110 are disabled for a certain time period, and the PFD 1 and PFD2 100 and 110 are again enabled if the enable signal EN is activated.

Figure 11:
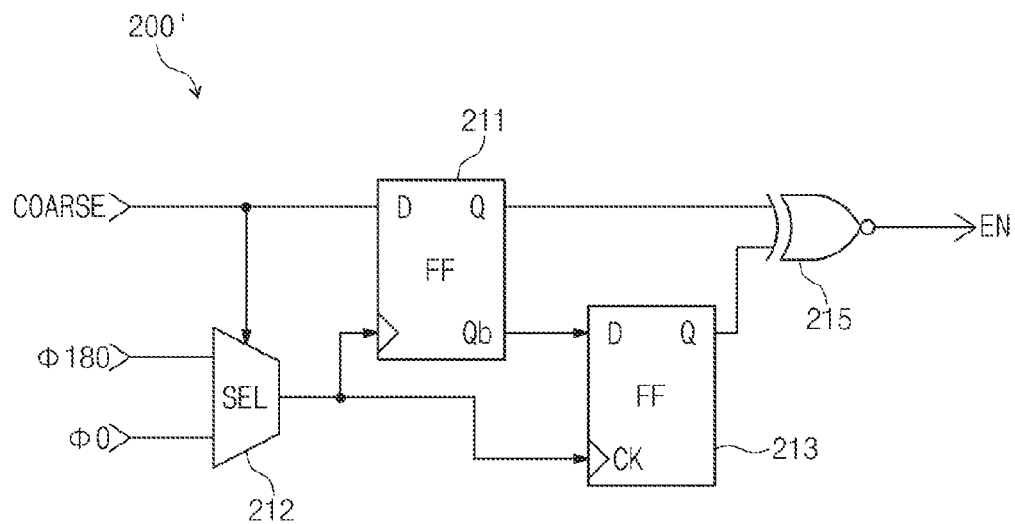
FIG. 11 is another exemplary circuit diagram of a phase frequency detecting controller of FIG. 8.

FIG. 11 is another example circuit diagram of a phase frequency detection controller (PFDC) included in the phase-rotating PLL of FIG. 8.

Referring to FIG. 11, the PFDC 200' includes the selector 212, flip flops 211 and 213, and an exclusive OR gate 215. Practically, the PFDC 200 of FIG. 8 has a structure that is obtained by removing the selector 212 from the PFDC 200' of FIG. 11. In this case, the second input clock signal ΦOUT2 of the multiplexer 160 is applied directly to the clock CK of each of the flip flops 211 and 213. In contrast to the DP PLL 500 of FIG. 8, as illustrated in FIG. 14, in a DP PLL 510, the selector 212 may be included in the PFDC 200' of FIG. 11. The PFDC 200' of FIG. 11 maintains the enable signal EN of FIG. 13 at the low level of the enable signal EN for a cycle of each of the first and second input clock signals ΦOUT1 and ΦOUT2. As a result, if the frequencies of the first and second input clock signals ΦOUT1 and ΦOUT2 change, the low section of the enable signal EN also changes due to the circuit structure of FIG. 11.

Figure 12:
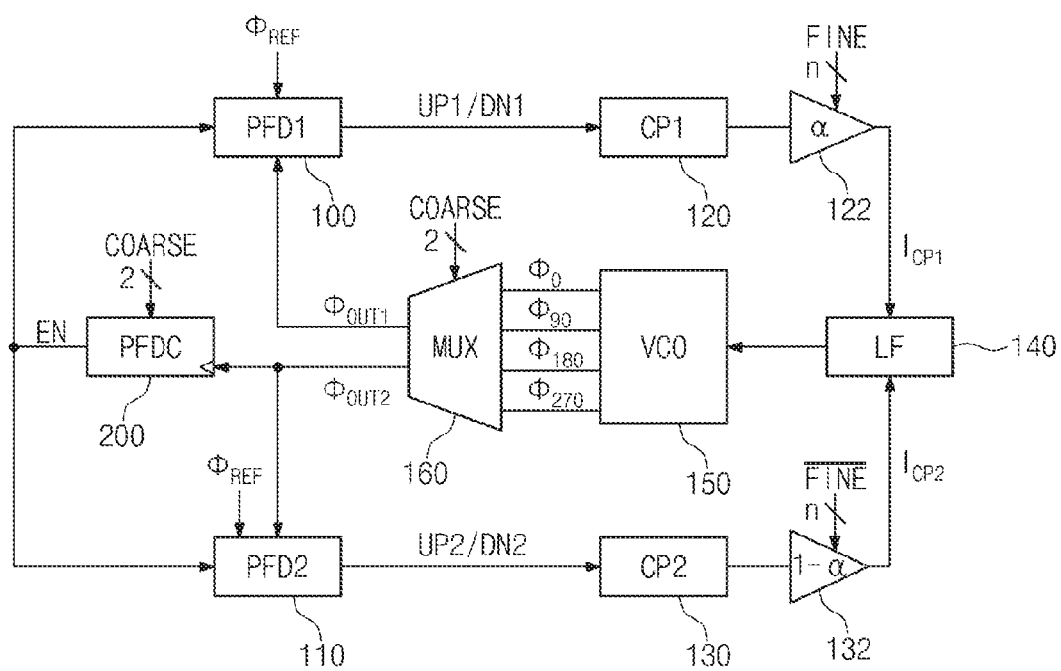
FIG. 12 is a detailed block diagram of a phase-rotating PLL of FIG. 8.

FIG. 12 is a detailed block diagram of a phase-rotating PLL of FIG. 8.

Referring to FIG. 12, the PFD1 100, the CP1 120, and the weighting unit 122 correspond to the first identical loop 115 of FIG. 8, and the PFD2 110, the CP2 130, and the weighting unit 132 correspond to the second identical loop 116 of FIG. 8.

The first and second identical loops 115 and 116 are activated in response to the enable signal EN and perform the operation of the phase-rotating PLL. The loop filter 140 and the VCO 150 are shared for the first and second identical loops 115 and 116.

The PFDC 200 receives the signal COARSE being a digital code and the second input clock signal ΦOUT2 and generates the enable signal EN. The PFDC 200 may be embodied as the PFDC 200' of FIG. 11.

The PFD1 100 compares the phase of the reference clock signal ΦREF with that of the first input clock signal ΦOUT1 to generate the first up signal UP1 or first down signal DN1 if the enable signal EN is HIGH.

The PFD2 110 compares the phase of the reference clock signal ΦREF with that of the second input clock signal ΦOUT2 to generate the second up signal UP2 or second down signal DN2 if the enable signal EN is HIGH.

FIG. 13 represents the timings of the enable signal EN generated from the PFDC 200 of FIG. 12 and up/down signals generated from the PFD1 and PFD2 100 and 110 when the phase difference between the first and second input clock signals □OUT1 and □OUT2 that are selectively output from the multiplexer 160 is 90 degrees.

FIG. 13 is an operational timing diagram according to FIG. 12.

FIG. 13 shows operational timings where the phase difference between the first and second input clock signals ΦOUT1 and ΦOUT2 is 90 degrees and the cycle of the first input clock signal ΦOUT1 is 800 ps.

The enable signal EN changes in response to the second input clock signal ΦOUT2 in order to activate the PFD1 and PFD2 100 and 110 at the right time. While the enable signal EN is in a low state, both the up and down signals DN1 and UP2 are low regardless of the input phase difference. On the contrary, if the enable signal EN goes to HIGH, both the up and down signals DN1 and UP2 that are output signals occur may vary in response to phase differences between the input clock signals ΦOUT1/ΦOUT2 and the reference clock signal ΦREF as shown through the waveforms DN1 and UP2.

The PFDC 200 generates the enable signal EN at the time point t2 in response to the rising edge of the second input clock signal □OUT2 at the time point t1 as indicated by arrow AR1. The delay tEN between the time points t1 and t2 is the operational delay of the PFDC 200.

As a result, the PFD1 and PFD2 100 and 110 are enabled by the enable signal EN that is generated at the time point t2 and has a high state. Thus, the PFD1 and PFD2 100 and 110 may start comparing phase right before two desired rising edges that are generated at the time points t3 and t4. Thus, in the case of FIG. 13, undesired interpolation does may not occur.

FIG. 14 is a block diagram of a phase-rotating PLL according to another example embodiment.

In the case of the DP-PLL of FIG. 5, phase interpolation may be performed between 90 degrees and 360 degrees although desired phase is between 0 degree and 90 degrees. Such an interpolation error is avoided by using the PFDC 200 of FIG. 12 that sets the right activation time of the PFD as shown in FIG. 13.

As illustrated in FIG. 14, a DP-PLL 510 may be formed of a relatively that has a simpler structure that does not include the multiplexer 160 of FIG. 12 while still avoiding an interpolation error.

Figure 15:
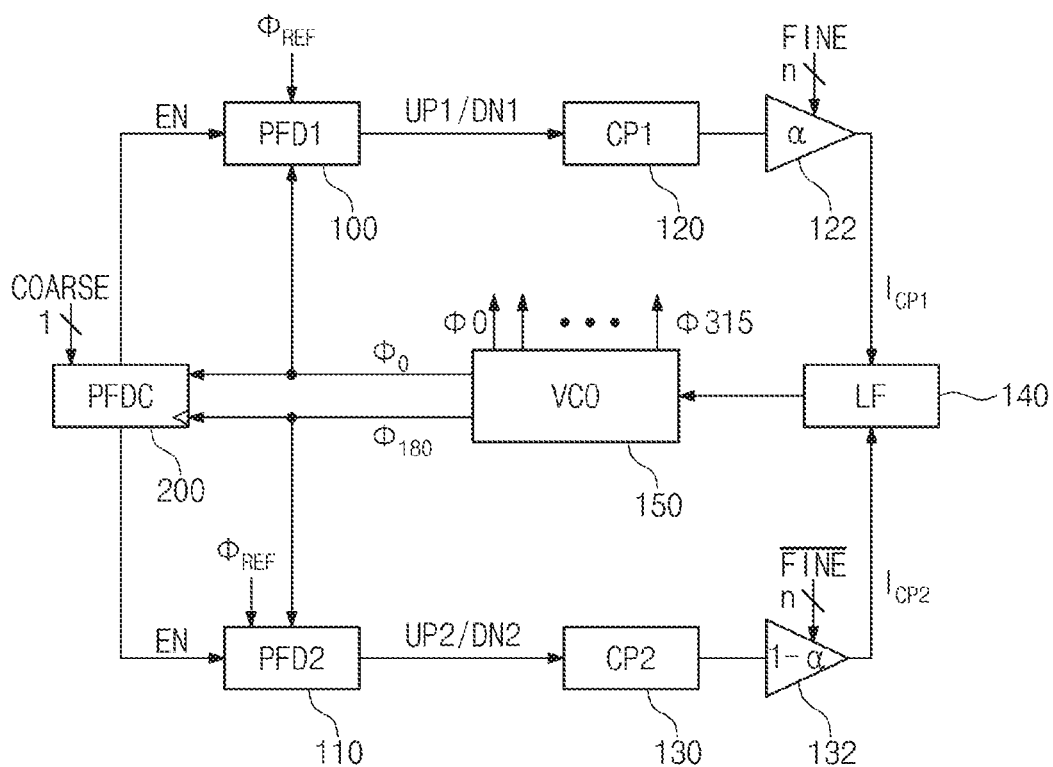
FIG. 15 is a detailed block diagram of a phase-rotating PLL of FIG. 14.
Figure 16:
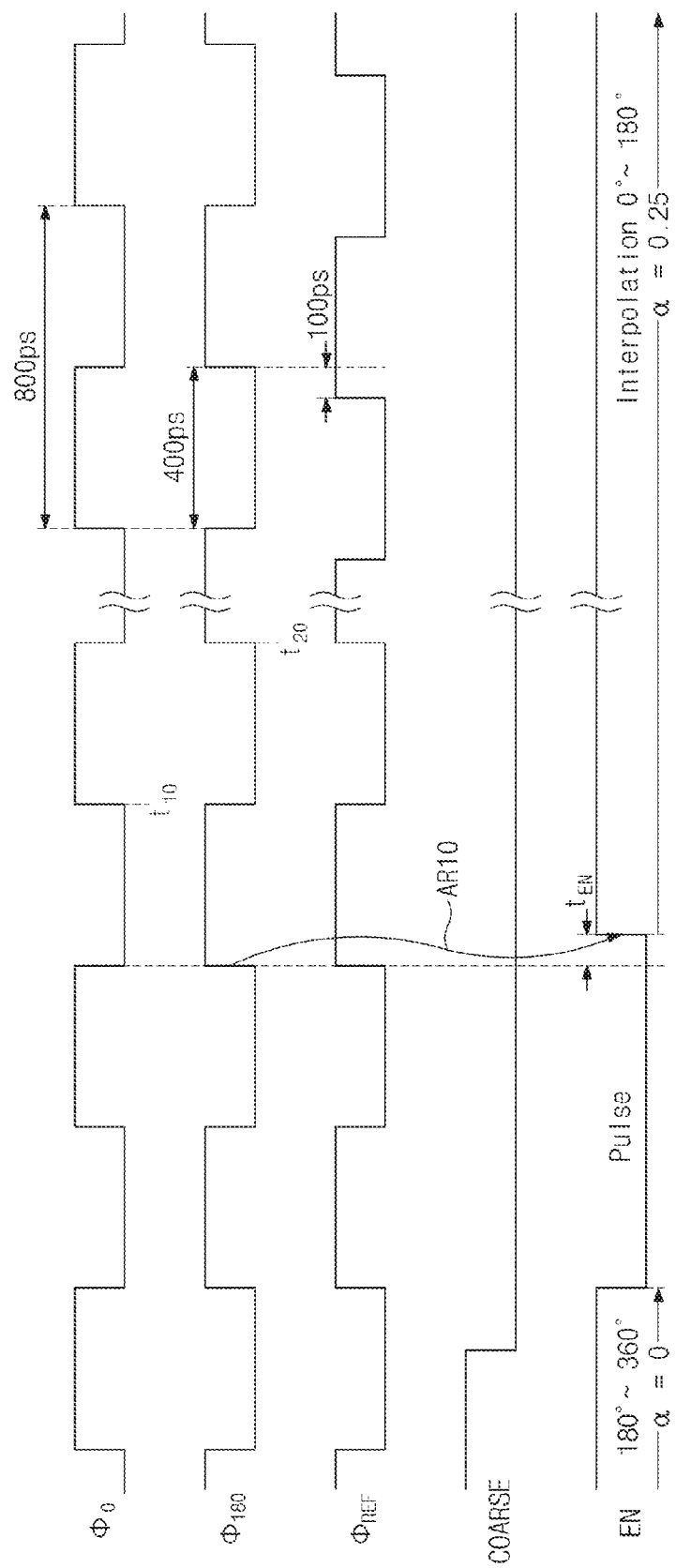
FIG. 16 is an operational timing diagram according to FIG. 15.
Figure 17:
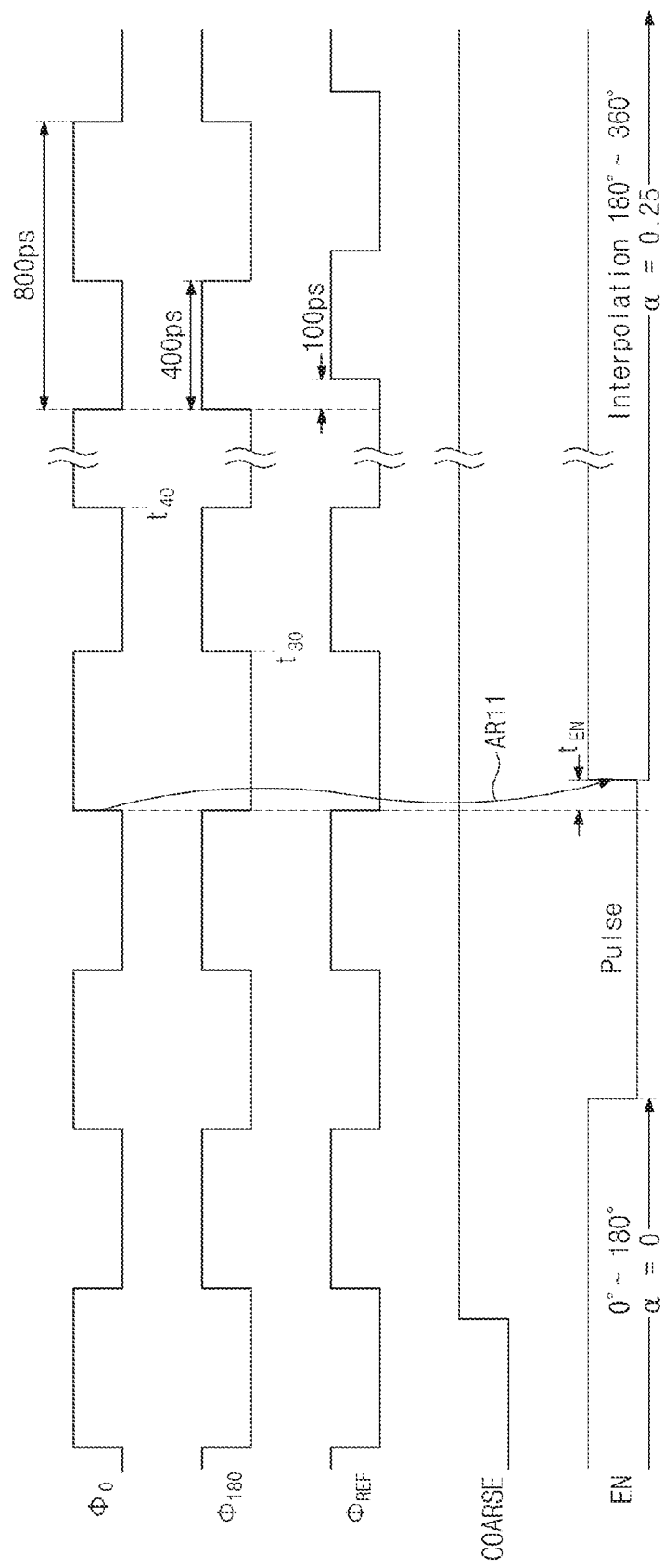
FIG. 17 is another operational timing diagram according to FIG. 15.

FIG. 15 is a detailed block diagram of a phase-rotating PLL of FIG. 14. FIG. 16 is an operational timing diagram corresponding to the phase-rotating PLL of FIG. 15, and FIG. 17 is another operational timing diagram corresponding to the phase-rotating PLL of FIG. 15.

Referring to FIG. 15, the DP-PLL 510 may include the PFD1 100, the CP1 120, and the weighting unit 122 in the first identical loop and the PFD2 110, the CP2 130, and the weighting unit 132 in the second identical loop.

The first and second identical loops are activated in response to the enable signal EN and perform the operation of the phase-rotating PLL. The loop filter and the VCO 150 are shared for the first and second identical loops.

The PFDC 200 receives the signal COARSE being a 1-bit digital code and the first and second input clock signals $\Phi_0$ and $\Phi_{180}$ and generates the enable signal EN.

The PFD1 100 compares the phase of the reference clock signal $\Phi$REF with that of the first input clock signal $\Phi_0$ to generate the first up signal UP1 or first down signal DN1 if the enable signal EN is HIGH.

The PFD2 110 compares the phase of the reference clock signal $\Phi$REF with that of the second input clock signal $\Phi_{180}$ to generate the second up signal UP2 or second down signal DN2 if the enable signal EN is HIGH.

The VCO 150 generates eight clock signals that include the first and second input clock signals $\Phi_0$ and $\Phi_{180}$.

The phase interpolation of FIG. 15 may be performed between two fixed clock phases, such as between $\Phi_0$ and $\Phi_{180}$. The PFD1 and PFD2 100 and 110 directly use the input clock signals $\Phi_0$ and $\Phi_{180}$ without any multiplexer. Instead, the DP-PLL 510 properly adjusts the activation time of the PFD1 and PFD2 100 and 110 so that a phase may be interpolated between 0 degree and 180 degrees (in the case of FIG. 16) or between 180 degrees and 360 degrees (in the case of FIG. 17). The PFDC 200 receives the signals $\Phi_0$ and $\Phi_{180}$ as the input clock signals in order to adjust the activation time depending on a desired phase.

Each time the coarse digital code changes, the PFD1 and PFD2 100 and 110 are inactivated according to a pulse for a short time (generally, a clock cycle) and again activated as indicated by arrow AR10 of FIG. 16 in response to the signals $\Phi_0$ and $\Phi_{180}$ depending on an interpolation range (for example, the current value of the coarse digital code). In order to interpolate the signals $\Phi_0$ and $\Phi_{180}$ at the time points t10 and t20 shown in FIG. 16, the PFD1 and PFD2 100 and 110 are simultaneously enabled by the enable signal EN that is transited based on the rising edge of the signal $\Phi_{180}$.

On the other hand, in the case of FIG. 17, in order to interpolate signals $\Phi_0$ and $\Phi_{180}$ at the time points t30 and t40, the PFD 1 and PFD 2 100 and 110 are simultaneously enabled by the enable signal EN that is transited form the rising edge of signal $\Phi_0$ as indicated by arrow AR11 of FIG. 17. Thus, a clock phase may be rotated through 360 degrees.

The DP-PLL of FIG. 15 may be implemented by using, for example, 65 nanometer (nm) CMOS processes. A digital code having five bits, namely, one bit for coarse control and four bits for fine control may be used, and the resolution of phase interpolation may be about 25 ps. Eight multi-phase 1.25 GHz clocks from the single VCO 150 may be simultaneously adjusted according to the 5-bit digital code.

Such a phase interpolation schema may make the topology of the DP-PLL relatively simpler by removing a multiplexer and related signal paths on the main loop of the PLL. Further, by removing the multiplexer and related signal paths, the clock path of the PLL may be relatively shorter thus reducing power consumption.

Figure 18:
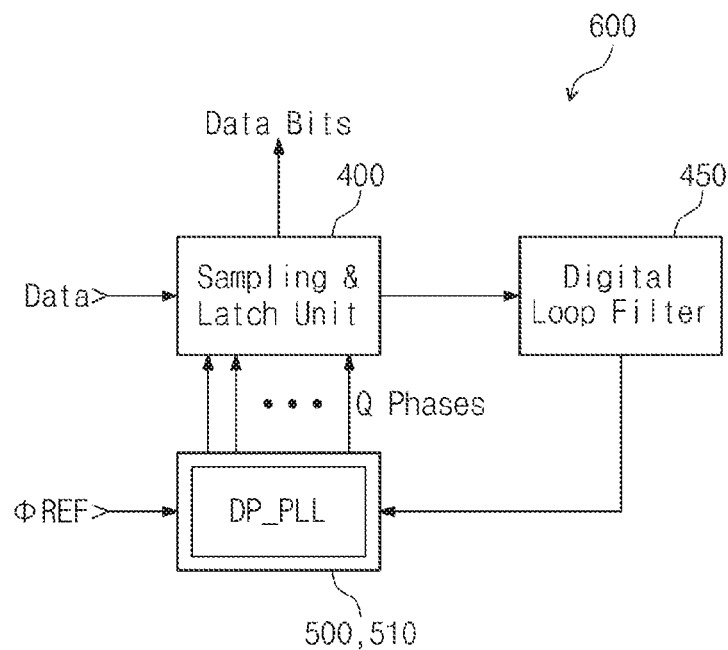
FIG. 18 is a block diagram of a phase interpolation based clock data recovery circuit.

FIG. 18 is a block diagram of a phase interpolation based clock data recovery circuit.

Referring to FIG. 18, a clock data recovery (CDR) circuit 600 includes a sampling and latch unit 400, a digital loop filter 450, and the DP-PLL 500 of FIG. 8 or the DP-PLL 510 of FIG. 14.

The DP-PLL 500 or 510 generates clock signals having constant frequencies using a reference clock $\Phi$REF.

The digital loop filter 450 performs loop filter on an input signal and generates a loop filtering output having a more gentle change. The loop filtering output is used for adjusting the phases of the clock signals of the DP-PLL 500 or 510. When the loop filtering output is a 5-bit code for example, the upper two bits may be used as the COARSE signal of the DP-PLL 500 or 510 and the lower three bits may be used as the FINE signal of the DP-PLL500 or 510.

The sampling and latch unit 400 recovers data by using phase-adjusted clock signals. Here, recovering the data means latch-outputs received data by using an aligned clock signal.

In the CDR circuit 600 of FIG. 18, the DP-PLL 500 or 510 may minimize and/or prevent phase interpolation errors and thus the recovery performance of the CDR circuit 600 may be more stable.

In a data communication system, as the system increases in speed and size, a scheme may be used in which a transmit terminal transmits only data except for a synchronization clock to a receive terminal. Because data transmit is minimized between the transmit and receive terminals, the receive terminal may need a clock that can accurately recover data distorted due to a limited channel bandwidth. Thus, the CDR circuit 600 that extracts a synchronized stable clock from data having a high transmission rate may be used in a receiver 1100 of FIG. 19. The data communication system includes a transmitter 1000 and the receiver 1100.

The transmitter 1000 transmits data through a transmission line L10.

The receiver 1100 may include a CDR, such the CDR 600 as shown in FIG. 18, and a de-multiplexer 700.

The CDR 600 adjusts the rising edge of clock output from the PLL so that the rising edge is aligned with the center of a data pulse. Data may be recovered using the adjusted clock having its edge aligned with the data.

The de-multiplexer 700 is connected to the CDR 600 and performs a function of de-multiplexing multiplexed, transmitted data.

As the operation speed in a synchronization semiconductor memory device quickens, the operational characteristics of the PLL may become important. For example, since the synchronous operation of clock may be needed when applying a read latency operation in a Double Data Rate Synchronous Dynamic Random Access Memory (DDR SDRAM) and an on die termination technology (ODT), the PLL may be embedded. Moreover, in order to reduce power consumption, a measure to effectively decrease power consumed in the PLL may be needed.

On the other hand, the ODT has been introduced to enhance signal integrity by minimizing signal reflection at the interface between a Stub Series Termination Logic (SSTL) based system and a memory. As a result, a motherboard has typically provided a termination voltage (VTT). However, in the case of an SDRAM over DDR2 specification, a DRAM and a memory controller may now provide the termination voltage by using the ODT.

Figure 19:
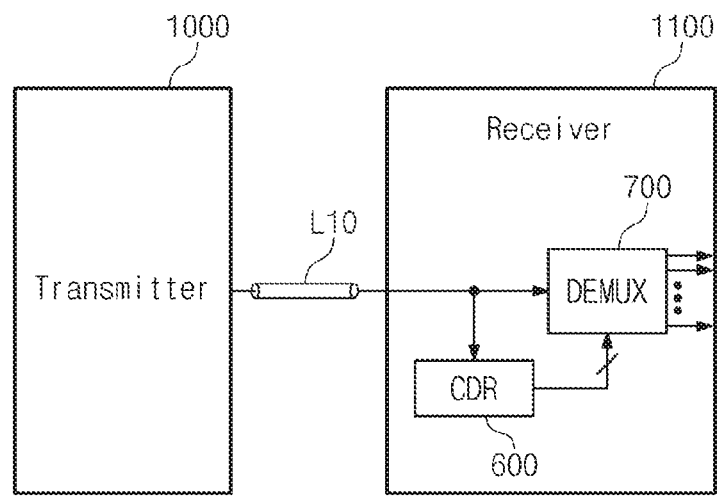
FIG. 19 is a block diagram of a data communication system to which the circuit of FIG. 18 is applied.

In the case of FIG. 19, since the phase interpolation errors of the PLL in the CDR 600 of the receiver 110 may be prevented or minimized, the reception performance of the receiver may be relatively more stable.

Figure 20:
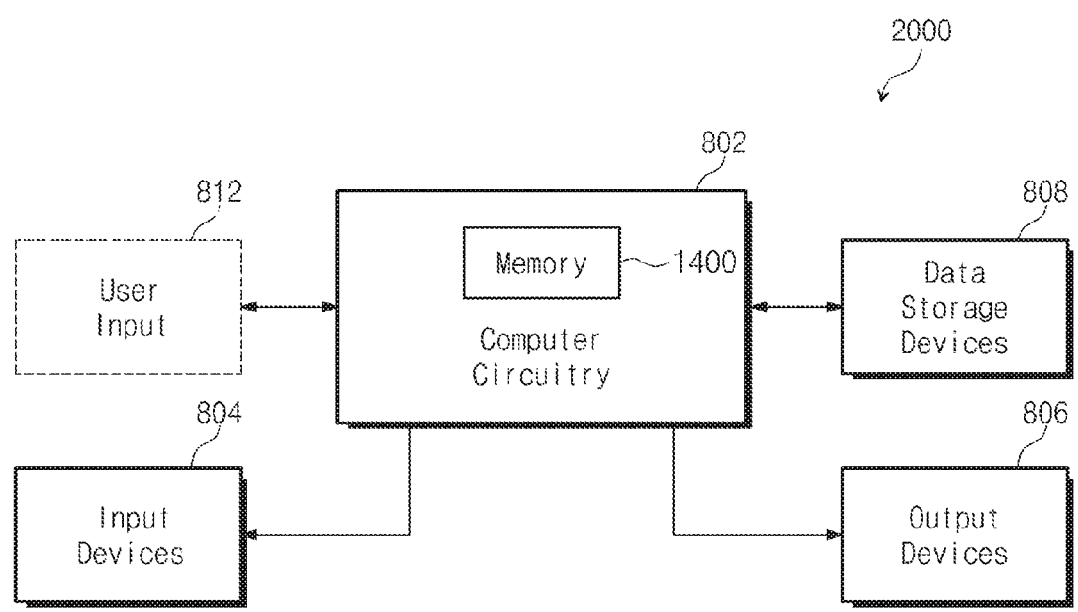
FIG. 20 is a block diagram of an application of example embodiments employed in a data processing apparatus.

FIG. 20 is a block diagram of an application of example embodiments employed in a data processing apparatus.

Referring to FIG. 20, a data processing apparatus 2000 may include a computer circuit 802 including a memory 1400, input devices 804, output devices 806, and data storage devices 808. Moreover, the data processing apparatus 2000 may further include a user input 812 for convenience of use. The user input 812 may be an input element that includes a numeric key, a function key, etc., and plays a role in interfacing an electronic system and a human being.

In such a case, since the computer circuit 802 or the data storage devices 808 of the data processing apparatus 2000 may have the DP-PLL 500/510, phase interpolation errors may be prevented or minimized. Thus, the operational performance of the data processing apparatus 2000 may be improved.

Some of the data storage devices 808 may be implemented as a non-volatile semiconductor memory device. The non-volatile semiconductor memory device including non-volatile memory cells may be an Electrically Erasable Programmable Read-Only Memory (EEPROM), a flash memory, a Magnetic RAM (MRAM), a spin-transfer torque MRAM, a Conductive bridging RAM (CBRAM), a Ferroelectric RAM (FeRAM), a Phase change RAM (PRAM) referred to also as a Ovonic Unified Memory (OUM), a Resistive RAM (RRAM or ReRAM), a nanotube RRAM, a Polymer RAM (PoRAM), a Nano Floating Gate Memory (NFGM), a holographic memory, a molecular electronics memory device, or an insulator resistance change memory.

The non-volatile memory cell may store one bit or multiple bits per one memory cell.

Figure 21:
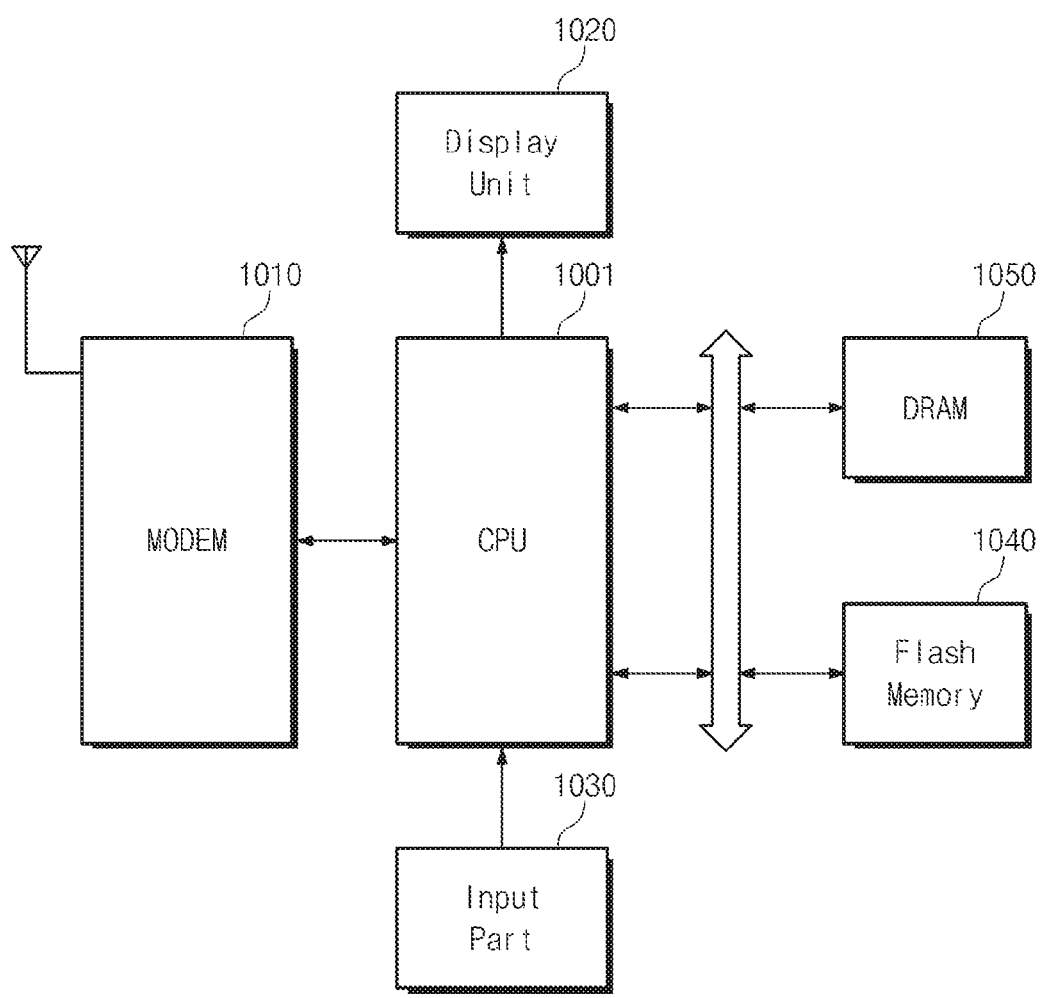
FIG. 21 is a schematic circuit diagram of an application of example embodiments employed in a mobile device.

FIG. 21 is a schematic circuit diagram of an application of example embodiments employed in a mobile device.

Referring to FIG. 21, the mobile device may include a modem 1010, a CPU 1001, a DRAM 1050, a flash memory 1040, a display unit 1020, and an input unit 1030.

The modem 1010 performs modulation and demodulation functions on communication data.

The CPU 1001 controls the overall operations of the mobile device according to a preset program.

The DRAM 1050 functions as a main memory of the CPU 1001 and may be a synchronous DRAM.

The flash memory 1040 may be a NOR or NAND type flash memory.

The display unit 1020 is a liquid crystal device, an OLED, etc. that has liquid crystal having backlight or an LED source, and may include a touch screen. The display unit 1020 functions as an output element that displays characters, numbers, and images including pictures with colors.

The input unit 1030 may be an input element that includes a numeric key, a function key, etc., and plays a role in interfacing between the electronic device and the human being.

The mobile device may function as a mobile communication apparatus, or function as a smart card or an SSD by adding or removing components if necessary.

The mobile device may be connected to an external communication apparatus through a separate interface. The communication apparatus may be a digital versatile disc (DVD) player, a computer, a set bop box (STB), a game console, and a digital camcorder.

The interface may be one of various interface protocols such as Universal Serial Bus (USB), Multi-Media Card (MMC), Peripheral Component Interconnect-Express (PCIE), Serial-attached SCSI (SAS), Serial Advanced Technology Attachment (SATA), Parallel Advanced Technology Attachment (PATA), Small Computer System Interface (SCSI), Enhanced Small Disk Interface (ESDI), Integrated Drive Electronics (IDE), etc.

Although not shown, it is obvious to a person skill in the art that the mobile device may further include application chipsets, a Camera Image Processor (CIS), a mobile DRAM, etc.

If necessary, the CPU 1001, the DRAM 1050, and the flash memory 1040 may be manufactured or packaged as one chip.

The chip that forms the mobile device may be mounted by using packages having various shapes. For example, the chip may be package as packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flat pack (TQFP), Small Outline (SOIC), Shrink Small Outline Package (SSOP), Thin Small Out line (TSOP), Thin Quad Flat pack (TQFP), System In Package (SIP), Multi Chip Package (MCP), Wafer-level Fabricated Package (WFP), Wafer-Level Processed Stack Package (WSP), etc.

Although FIG. 21 illustrates employing the flash memory 1040 as a non-volatile storage device, various non-volatile storage devices may be used. Further, the non-volatile storage device may store data information on various data forms such texts, graphics, software codes, etc.

In the case of the mobile device, the CPU 1001, the DRAN 1050, or the flash memory 1040 may include the DP-PLL 500/510, therefore, phase interpolation errors may be prevented or minimized. Thus, the clock synchronization of the mobile device may become stable and thus operation performance may be improved.

While example embodiments have been particularly shown and described with reference to illustrated example embodiments thereof, it will be understood by those of ordinary skill in the art that various changes in form and details may be made therein without departing from the spirit and scope of the example embodiments as defined by the following claims. For example, it is possible to change the circuit construction of the DP-PLL or a way of generating the enable signal without departing from the technical spirit of the example embodiments in other cases.

Moreover, although the example embodiments are described mainly on the DP-PLL, example embodiments are not limited thereto and may be widely applied to a phase synchronization field.

According to the example embodiments, since phase interpolation errors may be prevented or minimized, the performance of the PLL may be improved. Moreover, the circuit construction may be relatively compact due to a relatively simple circuit structure, and, therefore, power consumption may be minimized or decreased.

What is claimed is:

1. A phase frequency detector of a phase locked loop, the phase frequency detector comprising:
   a first flip flop configured to generate a latched output as a up signal according a reference clock signal, if an enable signal is in a first logic state;
   a second flip flop configured to generate a latched output as a down signal according an input clock signal, if the enable signal is in the first logic state; and
   a logic gate configured to gate the up signal and the down signal, wherein
   the enable signal transitions from the second logic state to the first logic state in response to a first specified rising edge of the input clock signal,
   the first and second flip flops together are configured to perform an operation of comparing a phase of the reference clock signal with a phase of the input clock signal at a second specified rising edge of the input clock signal occurring after the first specified rising edge, and
   the logic gate is configured to reset the first and second flip flops.

2. The phase frequency detector of claim 1, wherein the enable signal has a second logic state section each time a state of a coarse signal is transited.

3. The phase frequency detector of claim 1, wherein the first and second flip flops are D flip flops, and the D flip flops are configured to receive the enable signal with a data input in common.

4. The phase frequency detector of claim 1, wherein the first and second flip flops are configured to compare the phase of the reference clock signal with the phase of the input clock signal when the second specified rising edge of the input clock signal has a phase difference of less than 180 degrees from a specified rising edge of a different input clock signal associated with a different phase frequency detector of the phase locked loop.

* * * * *

UNITED STATES PATENT AND TRADEMARK OFFICE
CERTIFICATE OF CORRECTION

PATENT NO. : 9,654,118 B2  
APPLICATION NO. : 15/179202  
DATED : May 16, 2017  
INVENTOR(S) : Junhan Bae et al.

Page 1 of 1

It is certified that error appears in the above-identified patent and that said Letters Patent is hereby corrected as shown below:

On the Title Page

(72) Inventors should read: Junhan Bae, Yongin-si (KR); Kee-Won Kwon, Suwon-si (KR); Kyoungho Kim, Hwaseong-si (KR); Jung Hoon Chun, Suwon-si (KR); Youngsoo Sohn, Seoul (KR); Seok Kim, Suwon-si (KR)

Signed and Sealed this  
Fifth Day of November, 2019

Andrei Iancu  
*Director of the United States Patent and Trademark Office*